(12) United States Patent
Wong et al.

(10) Patent No.: US 9,443,969 B2
(45) Date of Patent: Sep. 13, 2016

(54) TRANSISTOR HAVING METAL DIFFUSION BARRIER

(71) Applicant: TAIWAN SEMICONDUCTOR MANUFACTURING COMPANY, LTD., Hsinchu (TW)

(72) Inventors: King-Yuen Wong, Tuen Mun N.T. (HK); Po-Chih Chen, Hsinchu (TW); Chen-Ju Yu, Jiaoxi Township (TW); Fu-Chih Yang, Fengshan (TW); Jiun-Lei Jerry Yu, Zhudong Township (TW); Fu-Wei Yao, Hsinchu (TW); Ru-Yi Su, Kouhu Township (TW); Yu-Syuan Lin, Lukang Township (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 159 days.

(21) Appl. No.: 13/948,925

(22) Filed: Jul. 23, 2013

(65) Prior Publication Data
US 2015/0028345 A1 Jan. 29, 2015

(51) Int. Cl.
*H01L 29/778* (2006.01)

(52) U.S. Cl.
CPC ................. *H01L 29/7787* (2013.01)

(58) Field of Classification Search
CPC .............. H01L 29/7787; H01L 29/66431
USPC ................... 257/76, 190, 191, 192
See application file for complete search history.

(56) References Cited

U.S. PATENT DOCUMENTS

| | | |
|---|---|---|
| 7,112,830 B2 | 9/2006 | Munns |
| 7,547,925 B2 | 6/2009 | Wong et al. |
| 2004/0119067 A1* | 6/2004 | Weeks et al. .................. 257/40 |
| 2007/0108456 A1 | 5/2007 | Wong et al. |
| 2012/0025270 A1* | 2/2012 | Chang et al. ....... H01L 29/1066 257/194 |
| 2012/0193637 A1* | 8/2012 | Kalnitsky .......... H01L 29/1066 257/76 |
| 2013/0256683 A1* | 10/2013 | Imanishi ............... H01L 29/778 257/76 |
| 2014/0091309 A1* | 4/2014 | Hallin ............... H01L 29/66462 257/76 |
| 2014/0203288 A1* | 7/2014 | Hsiung ........................... 257/76 |

OTHER PUBLICATIONS

Srivastava, P., et al., "Si Trench Around Drain (STAD) Technology of GaN-DHFETs on Si Substrate for Boosting Power Performance", IEEE, 2001.

* cited by examiner

*Primary Examiner* — Marcos D Pizarro
(74) *Attorney, Agent, or Firm* — Hauptman Ham, LLP

(57) ABSTRACT

A transistor includes a substrate, a channel layer over the substrate, an active layer over the channel layer, a metal diffusion barrier over the active layer, and a gate over the metal diffusion barrier. The active layer has a band gap discontinuity with the channel layer.

20 Claims, 11 Drawing Sheets

TRANSISTOR HAVING METAL DIFFUSION BARRIER

RELATED APPLICATIONS

The instant application is related to the following U.S. Patent Applications:

U.S. Patent Application titled "TRANSISTOR HAVING PARTIALLY OR WHOLLY REPLACED SUBSTRATE AND METHOD OF MAKING THE SAME," Ser. No. 13/944,779, now U.S. Application Publication No. 2015/0021666, published Jan. 22, 2015;

U.S. Patent Application titled "TRANSISTOR HAVING HIGH BREAKDOWN VOLTAGE AND METHOD OF MAKING THE SAME," Ser. No. 13/944,713, now U.S. Pat. No. 9,093,511, issued Jul. 28, 2015;

U.S. Patent Application titled "SEMICONDUCTOR DEVICE, HIGH ELECTRON MOBILITY TRANSISTOR (E-HEMT) AND METHOD OF MANUFACTURING," Ser. No. 13/944,625, now U.S. Pat. No. 8,866,192, issued Oct. 21, 2014;

U.S. Patent Application titled "TRANSISTOR HAVING BACK-BARRIER LAYER AND METHOD OF MAKING THE SAME," Ser. No. 13/944,584, now U.S. Application Publication No. 2015/0021665, published Jan. 22, 2015;

U.S. Patent Application titled "TRANSISTOR HAVING DOPED SUBSTRATE AND METHOD OF MAKING THE SAME," Ser. No. 13/944,494, now U.S. Pat. No. 8,901,609, issued Dec. 2, 2014;

U.S. Patent Application titled "TRANSISTOR HAVING A BACK-BARRIER LAYER AND METHOD OF MAKING THE SAME," Ser. No. 13/944,672, now U.S. Application Publication No. 2015/0021660, published Jan. 22, 2015;

U.S. Patent Application titled "TRANSISTOR HAVING OHMIC CONTACT BY GRADIENT LAYER AND METHOD OF MAKING SAME" Ser. No. 14/010,268), now U.S. Pat. No. 8,975,641, issued Mar. 10, 2015; and U.S. Patent Application titled "TRANSISTOR HAVING AN OHMIC CONTACT BY SCREEN LAYER AND METHOD OF MAKING THE SAME" Ser. No. 14/010,220, now U.S. Pat. No. 8,969,882, issued Mar. 3, 2015.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), and metal-insulator-semiconductor field-effect transistors (MISFETs). An E-HEMT is an enhancement mode field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs such as E-HEMTs, have a number of attractive properties including high electron mobility and the ability to transmit signals at high frequencies. However, metal atoms deposited to form metal gates used in HEMTs can diffuse down into device layers, especially during higher temperature manufacturing, and degrade some electrical properties of the HEMTs.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

An enhancement mode high electron mobility transistor (E-HEMT) in a metal insulator semiconductor field effect transistor (MISFET) structure with a metal diffusion barrier is disclosed. The E-HEMT is normally non-conductive between source and drain electrodes. As a positive voltage is applied to a gate, the E-HEMT provides an increased conductivity between source and drain electrodes.

Figure 1A:
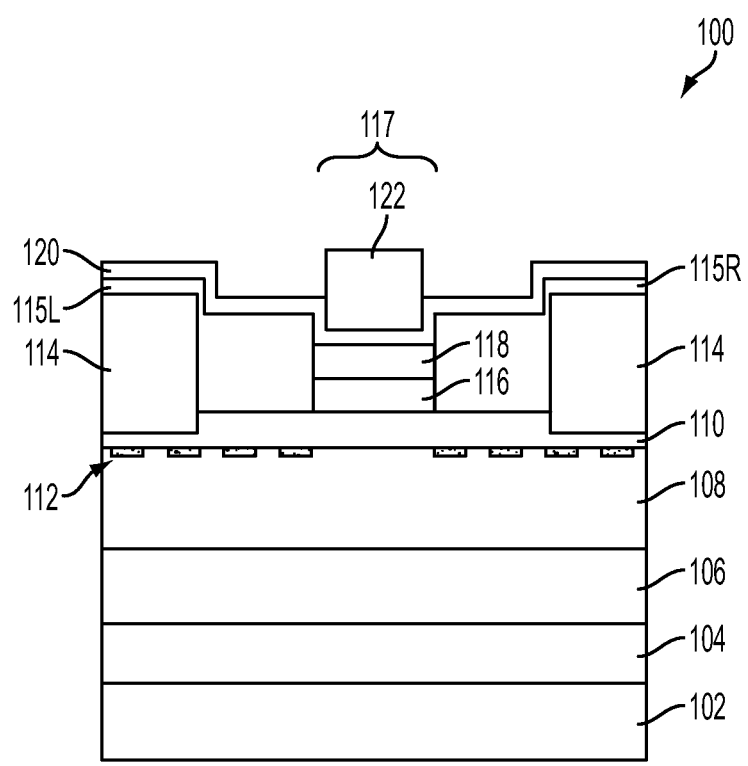
FIG. 1A is a cross-sectional view of high electron mobility transistor (HEMT), specifically, an enhancement mode high electron mobility transistor (E-HEMT), in accordance with one or more embodiments.

FIG. 1A is a cross-sectional view of a high electron mobility transistor (HEMT), specifically, an enhancement mode high electron mobility transistor (E-HEMT) 100, in accordance with one or more embodiments. E-HEMT 100 includes a substrate 102. Substrate 102 has a doped top surface. A nucleation layer 104 is over substrate 102. In some embodiments, nucleation layer 104 includes multiple layers, such as seed layers. A graded layer 106 is over the nucleation layer 104. A channel layer 108 is over graded layer 106. An active layer 110 is over channel layer 108. Due to a band gap discontinuity between channel layer 108 and active layer 110, a two dimensional electron gas (2-DEG) 112 is formed in the channel layer near an interface with the active layer. Source and drain electrodes 114 are over the channel layer 108. A dielectric layer 115 is over the source and drain electrodes 114 and a portion of the active layer 110. The dielectric layer 115 includes a left portion of the dielectric layer 115L and a right portion of the dielectric layer 115R, with a gap 117 in the dielectric layer between the left portion and the right portion. Between the source and drain electrodes 114 and in the gap 117 in the dielectric layer 115, a p-type doped gallium nitride (p-GaN) layer 116 is over the active layer 110. An n-type doped gallium nitride (n-GaN) layer 118 is over the p-GaN layer 116 between the source and drain electrodes 114 and in the gap 117 in the dielectric layer 115. A barrier layer 120 is over the n-GaN layer 118 and the dielectric layer 115. A gate 122 is over the barrier layer 120 between the source and drain electrodes 114 and in the gap 117 in the dielectric layer 115. Together the p-GaN layer 116, the n-GaN layer 118 and the barrier layer 120, form a metal diffusion barrier to mitigate or prevent metal atoms from the gate 122 from diffusing into the active layer 110 and the 2-DEG 112 in the channel layer 108.

Figure 1B:
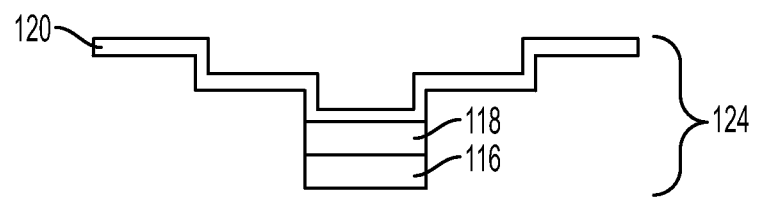
FIG. 1B is a cross-sectional view of a metal diffusion barrier portion of the E-HEMT of FIG. 1A, in accordance with one or more embodiments.

Briefly referring to FIG. 1B, FIG. 1B is a cross-sectional view of a metal diffusion barrier portion of the E-HEMT of FIG. 1A, in accordance with one or more embodiments. A metal diffusion barrier 124 includes the p-GaN layer 116, the n-GaN layer 118 and the barrier layer 120.

Returning to FIG. 1A, substrate 102 acts as a support for E-HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure.

The top surface of substrate 102 is doped with p-type dopants. In some embodiments, the p-type dopants include boron, aluminum, gallium, indium, titanium, boron di-fluoride, combinations thereof, or other suitable p-type dopants. The dopant concentration ranges from about $1 \times 10^{18}$ ions/cm$^3$ to about $1 \times 10^{23}$ ions/cm$^3$. In some embodiments, a depth of an implanted region of substrate 102 ranges from about 0.01 microns (μm) to about 0.5 μm from the top surface of the substrate. In some embodiments, the p-type dopants are implanted using an ion implantation process to implant dopants directly into substrate 102. In some embodiments, the p-type dopants are introduced using a plasma enhanced chemical vapor etching (PECVE) process, a reactive ion etching (RIE) process, or another suitable material removal process to remove a top portion of substrate 102 and then a doped layer is grown over the remaining portion of the substrate. In some embodiments, an anneal process is performed following the introduction of the p-type dopants. In some embodiments, the anneal process is performed at a temperature ranging from about 900° C. to about 1100° C., for a duration of up to 60 minutes.

Figure 2:
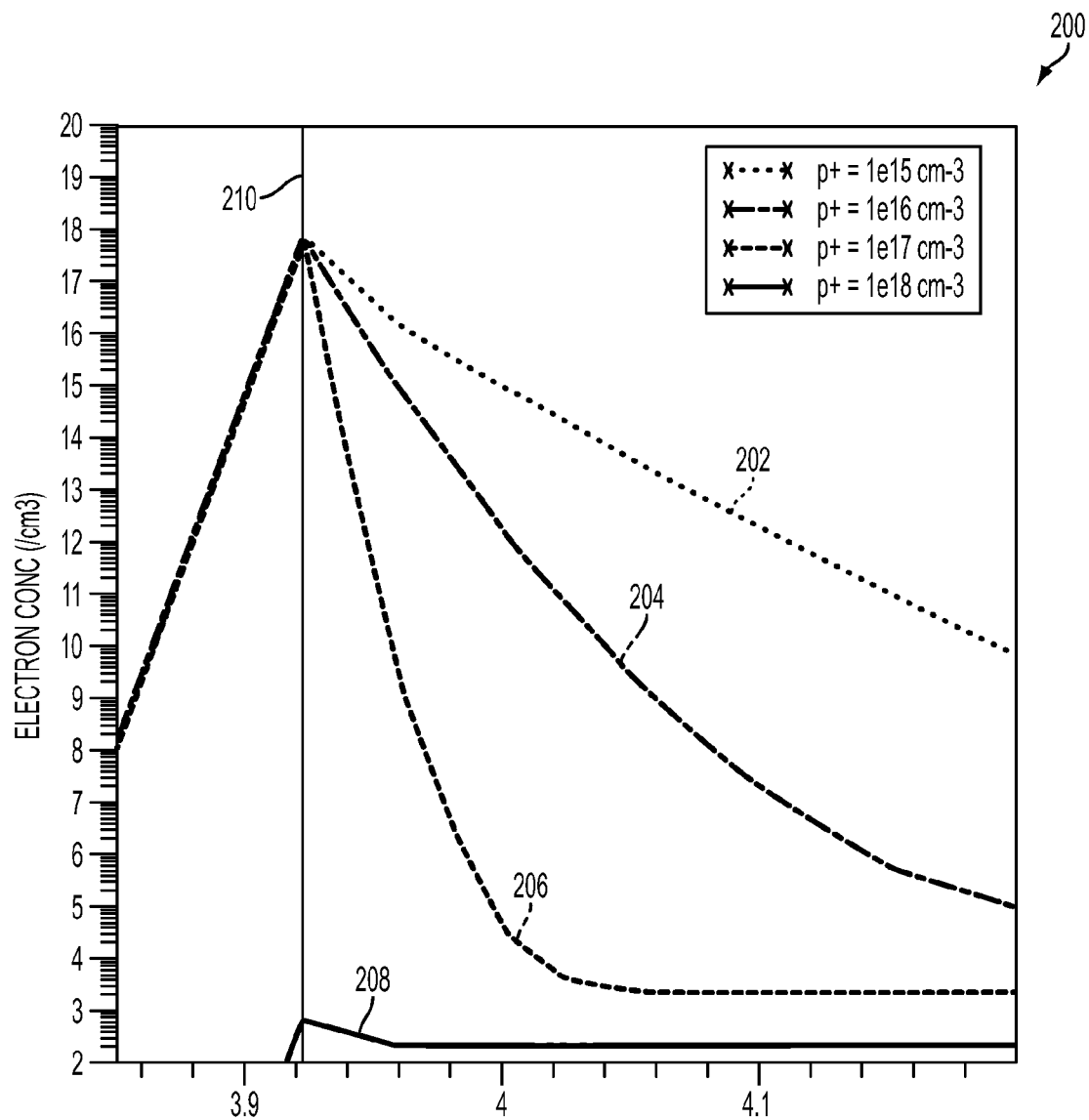
FIG. 2 is a graph of an electron concentration versus a depth in a HEMT in accordance with one or more embodiments.

The introduction of the p-type dopants helps to reduce a concentration of electrons present at the top surface of the substrate. FIG. 2 is a graph 200 of an electron concentration versus a depth in a HEMT in accordance with one or more embodiments. Graph 200 indicates an electron concentration 202 when the p-type dopant concentration is $1 \times 10^{15}$ ions/cm$^3$. Graph 200 indicates an electron concentration 204 when the p-type dopant concentration is $1 \times 10^{16}$ ions/cm$^3$. Graph 200 indicates an electron concentration 206 when the p-type dopant concentration is $1 \times 10^{17}$ ions/cm$^3$. Graph 200 indicates an electron concentration 208 when the p-type dopant concentration is $1 \times 10^{18}$ ions/cm$^3$. At an interface 210 between substrate 102 and nucleation layer 104, graph 200 indicates an electron concentration greater than 17 electrons/cm$^3$, for dopant concentrations ranging from $1 \times 10^{15}$ ions/cm$^3$ to $1 \times 10^{17}$ ions/cm$^3$. In contrast, graph 200 indicates an electron concentration of less than 3 electrons/cm$^3$, where the dopant concentration is $1 \times 10^{18}$ ions/cm$^3$. The lower electron concentration enables a higher voltage to be applied to gate 122 without damaging the HEMT. In some embodiments, the HEMT has a breakdown voltage equal to or greater than about 800 volts (V). As a result, the HEMT is able to be used in higher voltage applications in comparison with HEMTs which do not include substrate 102 having a doped top surface, as described above.

Returning to FIG. 1A, nucleation layer 104 helps to compensate for a lattice structure mismatch between substrate 102 and graded layer 106. In some embodiments, nucleation layer 104 includes multiple layers. In some embodiments, nucleation layer 104 includes a same material formed at different temperatures. In some embodiments, nucleation layer 104 includes a step-wise change in lattice structure. In some embodiments, nucleation layer 104 includes a continuous change in lattice structure. In some embodiments, nucleation layer 104 is formed by epitaxially growing the nucleation layer on substrate 102.

In at least one embodiment, nucleation layer 104 comprises a first layer of aluminum nitride (AlN) and a second layer of AlN over the first layer of AlN. The first layer of AlN is formed at a high temperature, ranging from about 1000° C. to about 1300° C., and has a thickness ranging from about 50 nanometers (nm) to about 200 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increased. The second layer of AlN is formed at a low temperature, ranging from about 900° C. to about 1000° C., and has a thickness ranging from about 20 nm to about 80 nm. The lower temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increased.

In some embodiments, nucleation layer 104 is omitted, and thus graded layer 106 is directly on substrate 102.

Graded layer 106 provides additional lattice matching between nucleation layer 104 and channel layer 108. In some embodiments, graded layer 106 is doped with p-type dopants to reduce the risk of electron injection from substrate 102. Electron injection occurs when electrons from substrate 102 diffuse into channel layer 108. By including p-type dopants, the electrons are trapped by the positively charged dopants and do not negatively impact performance of 2-DEG 112 in channel layer 108. In some embodiments, the p-type dopant concentration in graded layer 106 is greater than or equal to $1 \times 10^{17}$ ions/cm$^3$. In some embodiments, the p-type dopants include carbon, iron, magnesium, zinc or other suitable p-type dopants. In some embodiments, graded layer 106 includes aluminum gallium nitride (Al$_x$Ga$_{1-x}$N), where x is the aluminum content ratio in the graded layer. In some embodiments, the graded layer 106 includes multiple layers each having a decreased ratio x (from a layer adjoining nucleation layer 104 to a layer that adjoins channel layer 108, or from the bottom to the top portions of the graded layer). In some embodiments, graded layer 106 has a thickness ranging from about 550 nm to about 1050 nm. If graded layer 106 is too thin, electrons from substrate 102 will be injected into channel layer 110 at high voltages, negatively impacting 2-DEG 112 or a lattice mismatch between nucleation layer 104 and channel layer 108 will result in a high stress in the channel layer and increase a risk of layer separation. If graded layer 106 is too thick, material is wasted and production costs increase. In some embodiments, the graded layer 106 is formed at a temperature ranging from about 1000° C. to about 1200° C.

In some embodiments, a p-type dopant concentration of graded layer 106 increases from a bottom of the graded layer to a top of the graded layer.

In at least one embodiment, graded layer 106 includes three graded layers. A first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. A second graded layer is on the first graded layer. The second graded layer includes $Al_xGa_{1-x}N$, where x ranges from about 0.4 to about 0.6. A thickness of the second graded layer ranges from about 150 nm to about 250 nm. A third graded layer is on the second graded layer. The third graded layer includes $Al_xGa_{1-x}N$, where x ranges from about 0.15 to about 0.3. A thickness of the third graded layer ranges from about 350 nm to about 600 nm.

Channel layer 108 is used to help form a conductive path for selectively connecting electrodes 114. In some embodiments, channel layer 108 has a dopant concentration of p-type dopants of less than or equal to $1\times10^{17}$ ions/cm$^3$. In some embodiments, channel layer 108 includes undoped GaN. In some embodiments, channel layer 108 has a thickness ranging from about 0.5 µm to about 5.0 µm. If a thickness of channel layer 108 is too thin, the channel layer will not provide sufficient charge carriers to allow E-HEMT 100 to function properly. If the thickness of channel layer 108 is too great, material is wasted and production costs increased. In some embodiments, channel layer 108 is formed by an epitaxial process. In some embodiments, channel layer 108 is formed at a temperature ranging from about 1000° C. to about 1200° C.

Active layer 110 is used to provide the band gap discontinuity with channel layer 108 to form 2-DEG 112. In some embodiments, active layer 110 includes AlN. In some embodiments, active layer 110 includes a mixed structure, e.g., $Al_xGa_{1-x}N$, where x ranges from about 0.1 to 0.3. In some embodiments, active layer 110 includes both AlN and the mixed structure. In some embodiments, active layer 110 has a thickness ranging from about 10 nm to about 40 nm. In some embodiments where active layer 110 includes an AlN layer and a mixed structure layer, a thickness of the AlN layer ranges from about 0.5 nm to about 1.5 nm and a thickness of the mixed structure layer ranges from about 10 nm to about 40 nm. If active layer 110 is too thick, selectively controlling the conductivity of the channel layer is difficult. If active layer 110 is too thin, an insufficient amount of electrons are available for 2-DEG 112. In some embodiments, active layer 110 is formed using an epitaxial process. In some embodiments, active layer 110 is formed at a temperature ranging from about 1000° C. to about 1200° C.

2-DEG 112 acts as the channel for providing conductivity between electrodes 114. Electrons from a piezoelectric effect in active layer 110 drop into channel layer 108, and thus create a thin layer of highly mobile conducting electrons in the channel layer.

Electrodes 114 act as a source and a drain for E-HEMT 100 for transferring an electrical signal into or out of the E-HEMT. In some embodiments, source and drain electrodes 114 include titanium (Ti), aluminum (Al) and titanium nitride (TiN), combinations thereof, or other suitable conductors.

The dielectric layer 115 covers the source and drain electrodes 114 and portions of the active layer 110 which the dielectric layer 115 is over. The gap 117 in the dielectric layer 115 is for receipt of the metal diffusion barrier 124 and the gate 122. In some embodiments, the dielectric layer 115 is silicon nitride ($Si_3N_4$). In some embodiments, the dielectric layer 115 is formed by atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

The p-GaN layer 116 is part of the metal diffusion barrier 124 used to mitigate or prevent metal atoms from the gate 122 from diffusing downward into the active layer 110 and the 2-DEG 112 in the channel layer 108. Diffusion of metal atoms out of the gate 122 is a particular problem during high temperature operations used to form the E-HEMT 100. In some embodiments, p-GaN layer 116 has a dopant concentration of p-type dopants of less than or equal to $1\times10^{17}$ ions/cm$^3$. In some embodiments, p-GaN layer 116 includes undoped GaN. In some embodiments, p-GaN layer 116 has a thickness ranging from about 75 nanometers (nm) to about 100 nm. If a thickness of p-GaN layer 116 is too thin, the p-GaN layer will not provide sufficient thickness to mitigate or prevent metal atoms from the gate 122 from diffusing into the active layer 110 and the 2-DEG 112 in the channel layer 108 to allow E-HEMT 100 to function properly. If the thickness of p-GaN layer 116 is too great, material is wasted and production costs correspondingly increased. In some embodiments, p-GaN layer 116 is formed by an epitaxial process. In some embodiments, p-GaN layer 116 is formed at a temperature ranging from about 1000° C. to about 1200° C.

The n-GaN layer 118 is part of the metal diffusion barrier 124 used to mitigate or prevent metal atoms from the gate 122 from diffusing downward into the 2-DEG 112 in the channel layer 108. In some embodiments, n-GaN layer 118 has a dopant concentration of n-type dopants of less than or equal to $1\times10^{18}$ ions/cm$^3$. In some embodiments, n-GaN layer 118 includes undoped GaN. In some embodiments, n-GaN layer 118 has a thickness ranging from about 10 nm to about 30 nm. If a thickness of n-GaN layer 118 is too thin, the n-GaN layer will not provide sufficient thickness to mitigate or prevent metal atoms from the gate 122 from diffusing into the active layer 110 and the 2-DEG 112 in the channel layer 108 to allow E-HEMT 100 to function properly. If the thickness of n-GaN layer 118 is too great, material is wasted and production costs correspondingly increased. In some embodiments, n-GaN layer 118 is formed by an epitaxial process. In some embodiments, n-GaN layer 118 is formed at a temperature ranging from about 1000° C. to about 1200° C.

The barrier layer 120 is part of the metal diffusion barrier 124 used to mitigate or prevent metal atoms from the gate 122 from diffusing downward into the 2-DEG 112 in the channel layer 108. The barrier layer 120 also acts to passivate process plasma defects in an interface with the n-GaN layer 118 and mitigates or prevents current leakage from the gate 122. The barrier layer 120 includes AlN. In some embodiments, the barrier layer 120 includes one or more of AlN, silicon dioxide ($SiO_2$), silicon nitride ($Si_3N_4$), gallium oxide ($Ga_2O_3$), scandium oxide ($Sc_2O_3$), hafnium oxide ($HfO_2$) and related compounds. In some embodiments, barrier layer 120 has a thickness ranging from about 5 angstroms (Å) to about 30 Å. If a thickness of the barrier layer 120 is too thin, the barrier layer 120 will not provide sufficient thickness to mitigate or prevent metal atoms from the gate 122 from diffusing into the active layer 110 and the 2-DEG 112 in the channel layer 108 to allow E-HEMT 100 to function properly. Furthermore, if the thickness of the barrier layer 120 is too thin, the barrier layer 120 will not provide sufficient passivation or mitigation of current leakage from the gate 122. If the thickness of the barrier layer 120 is too great, material is wasted and production costs correspondingly increased. In some embodiments, barrier layer 120 is formed by atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

The gate 122 helps to modulate conductivity of 2-DEG 112 for transferring an electrical signal between electrodes 114. Without an applied positive voltage, E-HEMT 100 is normally not conductive, meaning that a positive voltage applied to gate 122 will raise the conductivity between electrodes 114 along 2-DEG 112. In some embodiments, the gate 122 includes titanium nitride (TiN), nickel gold alloy (NiAu), tungsten (W), tungsten nitride (WN), combinations thereof, or other suitable conductors. In some embodiments, the gate 122 has a thickness ranging from about 1,000 Å to about 5,000 Å.

Figure 3:
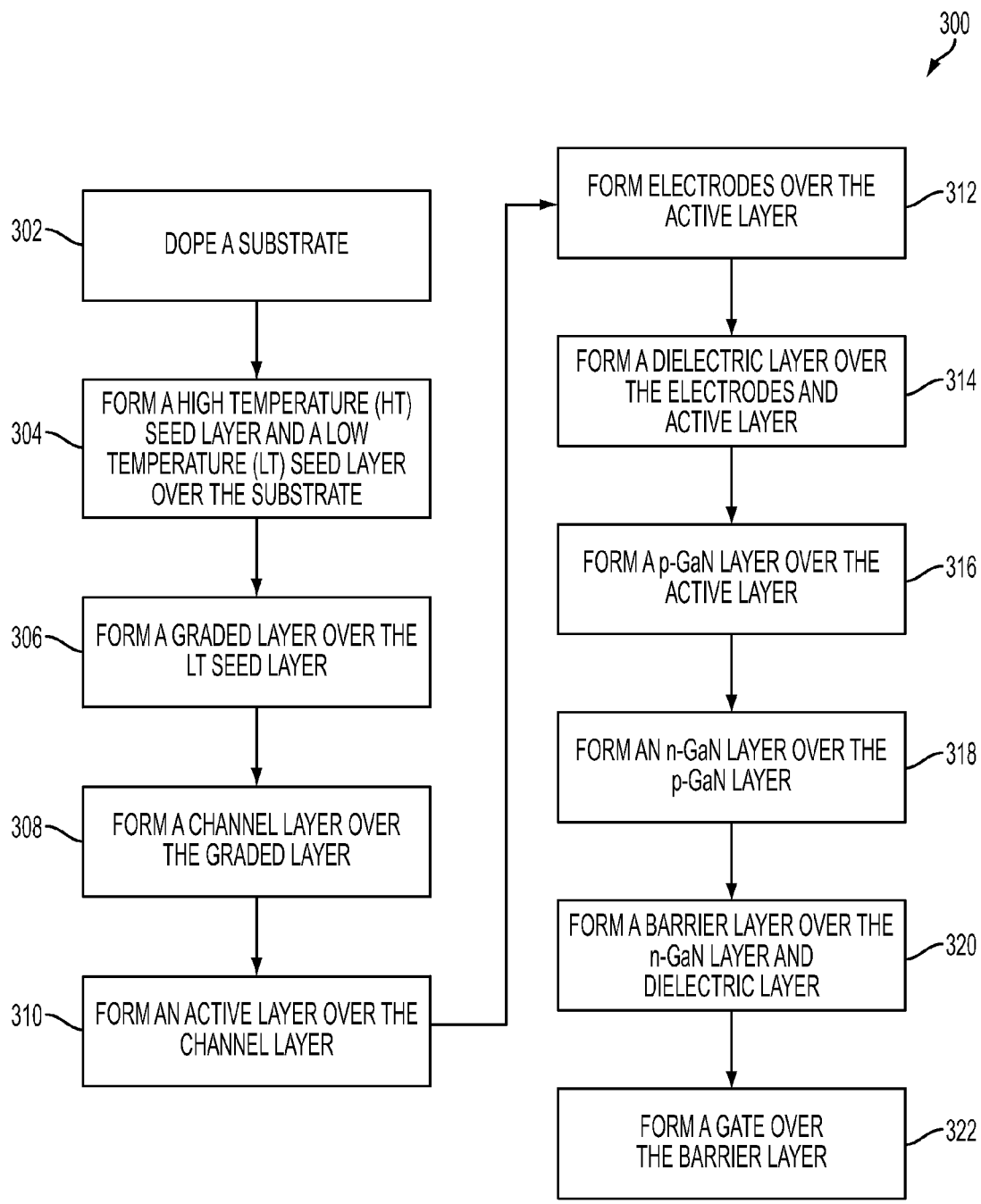
FIG. 3 is a flow chart of a method of making an E-HEMT in accordance with one or more embodiments.

FIG. 3 is a flow chart of a method 300 of making an E-HEMT in accordance with one or more embodiments. Method 300 begins with operation 302 in which a substrate is doped. In some embodiments, the substrate is doped by ion implantation. In some embodiments, a doped layer is formed over the substrate by using a PECVE, reactive ion etching (RIE) or other suitable material removal process to remove a portion of the substrate and then epitaxially grow a doped layer on the remaining portion of the substrate.

Figure 4:
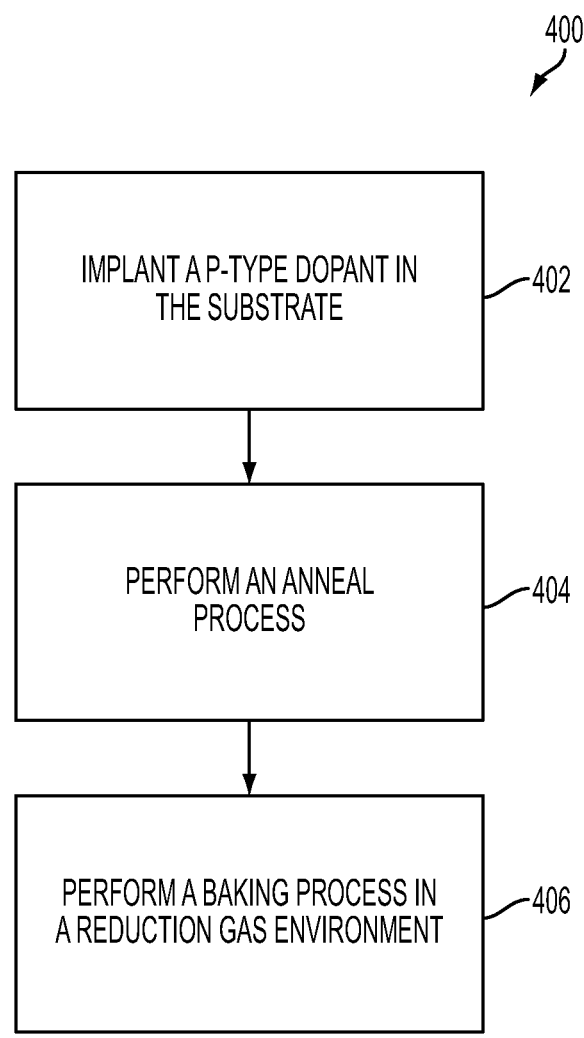
FIG. 4 is a flow chart of a method of doping a substrate in accordance with one or more embodiments.

FIG. 4 is a flow chart of a method 400 of doping a substrate in accordance with one or more embodiments. Method 400 begins with operation 402 in which dopants are implanted in the substrate. The dopants are p-type dopants. In some embodiments, the dopants include boron, aluminum, gallium, indium, titanium, boron di-fluoride or other suitable p-type dopants. In some embodiments, an energy of the implantation process ranges from about 30 kilo electronvolts (keV) to about 100 keV; and a depth to which the dopants are implanted ranges from about 0.01 µm to about 0.5 µm. In some embodiments, a tilt angle of the implantation process ranges from about 5-degrees to about 10-degrees. The implantation process continues until the dopant concentration in the substrate reaches about $1 \times 10^{18}$ ions/cm$^3$ to about $1 \times 10^{23}$ ions/cm$^3$.

In operation 404, the doped substrate is subjected to an anneal process. A temperature of the anneal process ranges from about 900° C. to about 1100° C. In some embodiments, a duration of the anneal process is up to 60 minutes. The anneal process helps to diffuse the dopants through the substrate. In some embodiments, operation 404 is omitted and the doped substrate is not subjected to an anneal process.

In operation 406, the doped substrate is subjected to a baking process in a reduction gas environment. In some embodiments, the reduction gas environment contains ionized hydrogen gas, a hydrogen-containing gas or another suitable reduction gas. In some embodiments, the hydrogen is ionized by a plasma process such as in-situ plasma or remote plasma. A temperature of the baking process ranges from about 900° C. to about 1100° C. In some embodiments, a duration of the baking process is up to 3 minutes. The baking process helps to reduce oxides formed on the substrate using a reduction reaction. In some embodiments, operations 404 and 406 are performed simultaneously.

Returning to FIG. 3, method 300 continues with operation 304 in which a low temperature (LT) seed layer and a high temperature (HT) seed layer are formed on a substrate, e.g., substrate 102. The HT seed layer is formed on the substrate and the LT seed layer is formed on the HT seed layer.

In some embodiments, LT seed layer and HT seed layer include AlN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer had a thickness ranging from about 20 nm to about 80 nm. In some embodiments, the LT seed layer is formed at a temperature ranging from about 900° C. to about 1000° C.

Method 300 continues with operation 306 in which a graded layer is formed on the LT seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the graded layer is formed at a temperature ranging from about 1000° C. to about 1200° C. In some embodiments, the graded layer is doped with p-type dopants, such as carbon, iron, magnesium, zinc or other suitable p-type dopants.

In at least one embodiment, a first graded layer is formed on the LT seed layer. The first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. In some embodiments, the first graded layer is formed using epitaxy. In some embodiments, the first graded layer is formed at a temperature ranging from about 1000° C. to about 1200° C. A second graded layer is formed on the first graded layer. The second graded layer includes $Al_xGa_{1-x}N$, where x ranges from about 0.4 to about 0.6. A thickness of the second graded layer ranges from about 150 nm to about 250 nm. In some embodiments, the second graded layer is formed using epitaxy. In some embodiments, the second graded layer is formed at a temperature ranging from about 1000° C. to about 1200° C. A third graded layer is formed on the second graded layer. The third graded layer includes $Al_xGa_{1-x}N$, where x ranges from about 0.15 to about 0.3. A thickness of the third graded layer ranges from about 350 nm to about 600 nm. In some embodiments, the third graded layer is formed using epitaxy. In some embodiments, the third graded layer is formed at a temperature ranging from about 1000° C. to about 1200° C.

Figure 5A:
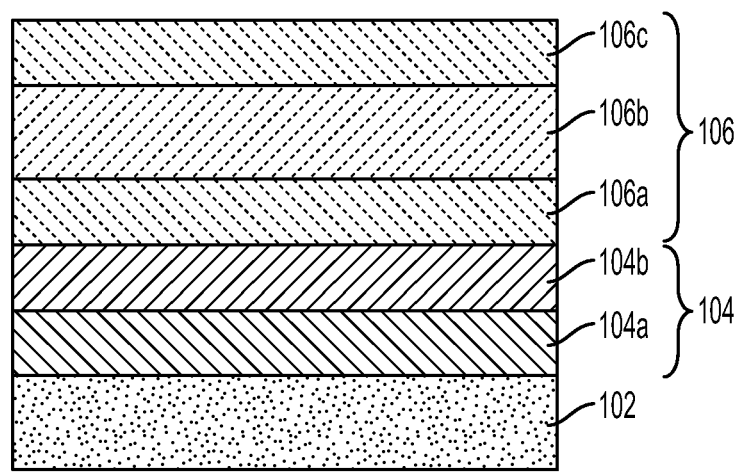
FIGS. 5A-5G are cross-sectional view of a E-HEMT at various stages of production in accordance with one or more embodiments.

FIG. 5A is a cross-sectional view of a E-HEMT following operation 306 and method 400. The E-HEMT includes nucleation layer 104 on substrate 102. Nucleation layer 104 includes a HT seed layer 104a on substrate 102 and a LT seed layer 104b on the HT seed layer 104a. Graded layer 106 is on nucleation layer 104. Graded layer 106 includes a first graded layer 106a on LT seed layer 104b. Graded layer 106 further includes a second graded layer 106b on first graded layer 106a, and a third graded layer 106c on the second graded layer 106b. For the same of simplicity, nucleation layer 104 and graded layer 106 are shown as single layer in the remaining cross-sectional views.

Returning to FIG. 3, in operation 308 a channel layer is formed on the graded layer. In some embodiments, the channel layer includes p-type dopants. In some embodiments, the channel layer includes GaN, and the P-type doping is implemented by using dopants including carbon, iron, magnesium, zinc or other suitable p-type dopants. In some embodiments, the channel layer is formed by performing an epitaxial process. In some embodiments, the epitaxial process includes a MOCVD process, a MBE process, a HVPE process or another suitable epitaxial process. In some embodiments, the channel layer has a thickness ranging from about 0.2 μm to about 1.0 μm. In some embodiments, the dopant concentration in the channel layer is equal to or less than about $1\times10^{17}$ ions/cm$^3$. In some embodiments, the channel layer is undoped. In some embodiments, the channel layer is formed at a temperature ranging from about 1000° C. to about 1200° C.

Figure 5B:
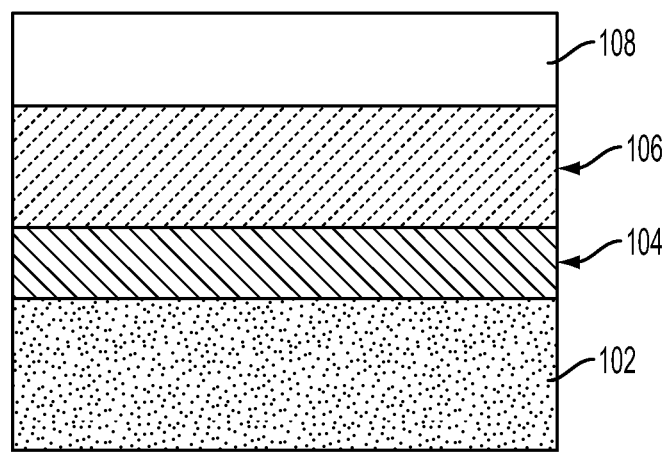

FIG. 5B is a cross-sectional view of the E-HEMT following operation 308 in accordance with one or more embodiments. The E-HEMT includes channel layer 108 on graded layer 106.

Returning to FIG. 3, in operation 310 an active layer is formed on the channel layer. In some embodiments, the active layer includes AlN, $Al_xGa_{1-x}N$, combinations thereof or other suitable materials. In some embodiments, x ranges from about 0.1 to about 0.3. In some embodiments, the active layer is formed by performing an epitaxial process. In some embodiments, the epitaxial process includes a MOCVD process, a MBE process, a HVPE process or another suitable epitaxial process. In some embodiments, the active layer has a thickness ranging from about 10 nm to about 40 nm. In some embodiments where the active layer includes both AlN and $Al_xGa_{1-x}N$, the AlN layer has a thickness ranging from about 0.5 nm to about 1.5 nm and the $Al_xGa_{1-x}N$ layer has a thickness ranging from about 10 nm to about 40 nm. In some embodiments, the active layer is formed at a temperature ranging from about 1000° C. to about 1200° C.

Figure 5C:
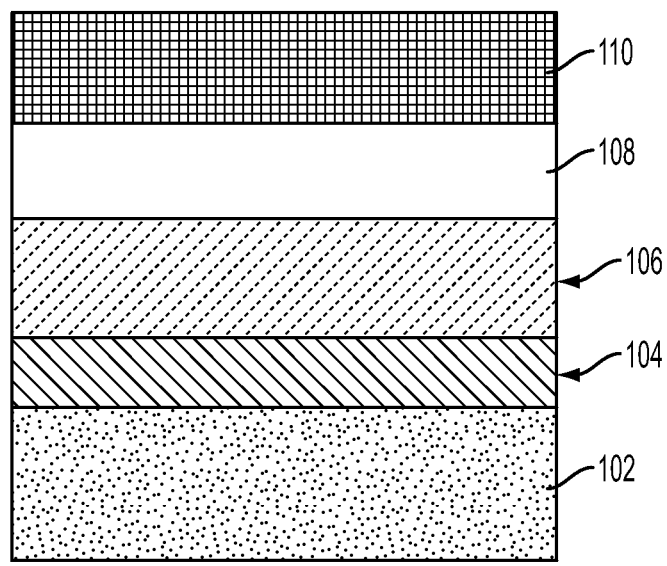

FIG. 5C is a cross-sectional view of the E-HEMT following operation 310 in accordance with one or more embodiments. The E-HEMT includes active layer 110 on channel layer 108. 2-DEG 112 is formed in channel layer 108 due to the band gap discontinuity between active layer 110 and the channel layer.

Returning to FIG. 3, in operation 312 source and drain electrodes are formed on the active layer, over left and right portions of the channel layer, respectively. In some embodiments, a patterned mask layer (i.e., a photoresistive layer) is formed on the upper surface of the active layer, and an etching process is performed to remove a portion of the active layer to form openings. In some embodiments these openings partially expose upper surfaces of the left and right portions of the channel layer. A metal layer is then deposited over the patterned active layer and fills the openings. Another patterned photoresist layer is formed over the metal layer, and the metal layer is etched to form the electrodes over the openings. In some embodiments, the metal layer for forming the electrodes includes one or more of titanium (Ti), aluminum (Al), titanium nitride (TiN). In some embodiments, the electrodes include one or more layers of conductive materials. In at least one embodiment, the electrodes include at least one barrier layer contacting the channel layer and/or the active layer.

Figure 5D:
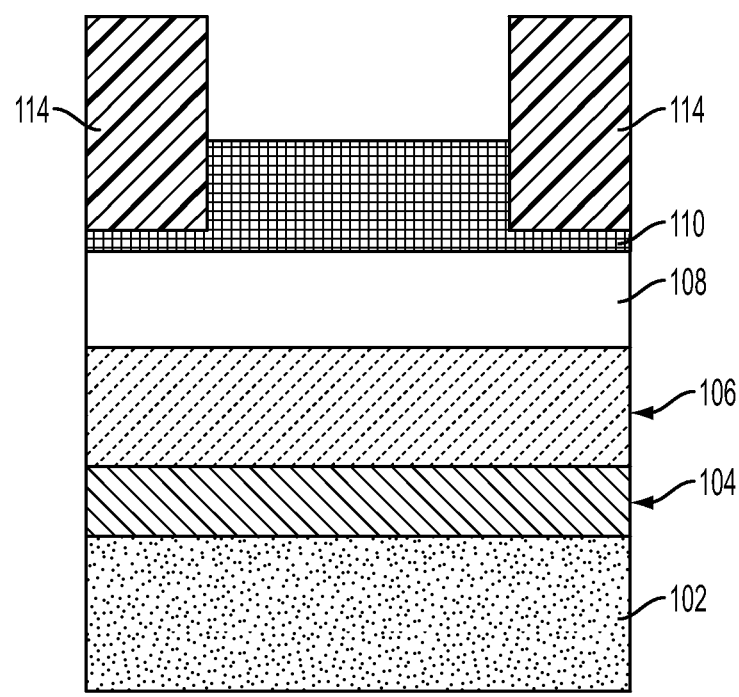

FIG. 5D is a cross-sectional view of the E-HEMT following operation 312 in accordance with one or more embodiments. The E-HEMT includes the source and drain electrodes 114 over the active layer 110 over the channel layer 108.

Returning to FIG. 3, in operation 314 a dielectric layer is formed over the electrodes and over the active layer. In some embodiments, a patterned mask layer (i.e., a photoresistive layer) is formed on the dielectric layer, and an etching process is performed to remove a portion of the dielectric layer to form a gap in the dielectric layer. In some embodiments the gap in the dielectric layer exposes an upper surface of the active layer where a metal diffusion barrier and a gate are formed over. In some embodiments the dielectric layer is silicon nitride ($Si_3N_4$). In some embodiments, the dielectric layer is formed by atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

Figure 5E:
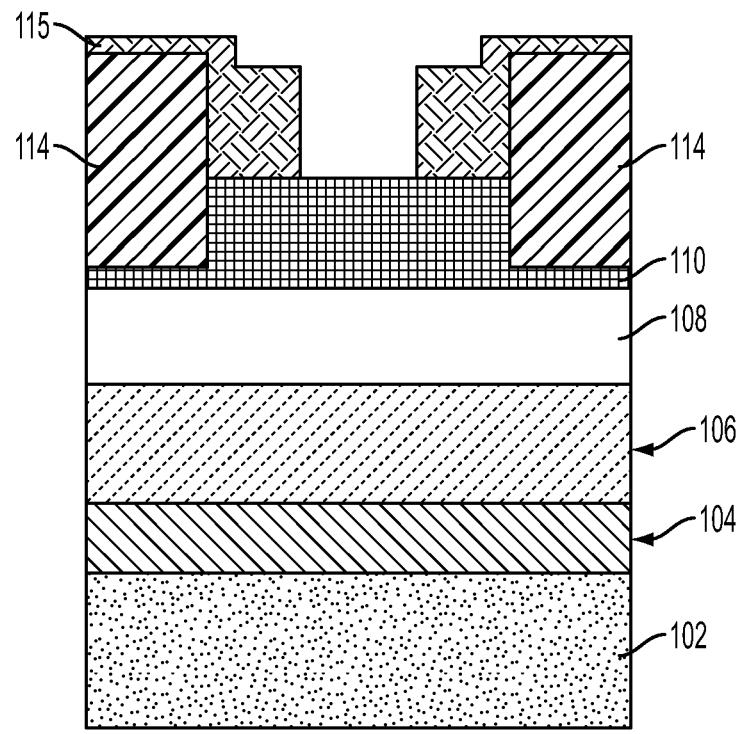

FIG. 5E is a cross-sectional view of the E-HEMT following operation 314 in accordance with one or more embodiments. The E-HEMT includes the dielectric layer 115 over the source and drain electrodes 114 and over a portion of the active layer 110.

In operation 316 a p-GaN layer is formed over the active layer in the gap in the dielectric layer. In some embodiments, a patterned mask layer (i.e., a photoresistive layer) is formed on the p-GaN layer, and an etching process is performed to remove the p-GaN layer except for a portion of the p-GaN layer in the gap in the dielectric layer. In some embodiments, p-GaN layer has a dopant concentration of p-type dopants of less than or equal to $1\times10^{17}$ ions/cm$^3$. In some embodiments, p-GaN layer includes undoped GaN. In some embodiments, p-GaN layer has a thickness ranging from about 75 nanometers (nm) to about 100 nm. In some embodiments, the p-type doping in the p-GaN layer is implemented by using dopants including carbon, iron, magnesium, zinc or other suitable p-type dopants. In some embodiments, the p-GaN layer is formed by performing an epitaxial process. In some embodiments, the epitaxial process includes a MOCVD process, a MBE process, a HVPE process or another suitable epitaxial process. In some embodiments, p-GaN layer is formed by an epitaxial process. In some embodiments, p-GaN layer is formed at a temperature ranging from about 1000° C. to about 1200° C.

In operation 318 an n-GaN layer is formed on the p-GaN layer. In some embodiments, a patterned mask layer (i.e., a photoresistive layer) is formed on the n-GaN layer, and an etching process is performed to remove the n-GaN layer except for a portion of the n-GaN layer over the p-GaN layer. In some embodiments, n-GaN layer has a dopant concentration of n-type dopants of less than or equal to $1 \times 10^{18}$ ions/cm$^3$. In some embodiments, n-GaN layer includes undoped GaN. In some embodiments, n-GaN layer has a thickness ranging from about 10 nm to about 30 nm. In some embodiments, the n-type doping in the n-GaN layer 116 is implemented by using dopants including silicon, germanium, or other suitable n-type dopants. In some embodiments, the n-GaN layer 116 is formed by performing an epitaxial process. In some embodiments, the epitaxial process includes a MOCVD process, a MBE process, a HVPE process or another suitable epitaxial process. In some embodiments, n-GaN layer is formed by an epitaxial process. In some embodiments, n-GaN layer is formed at a temperature ranging from about 1000° C. to about 1200° C.

Figure 5F:
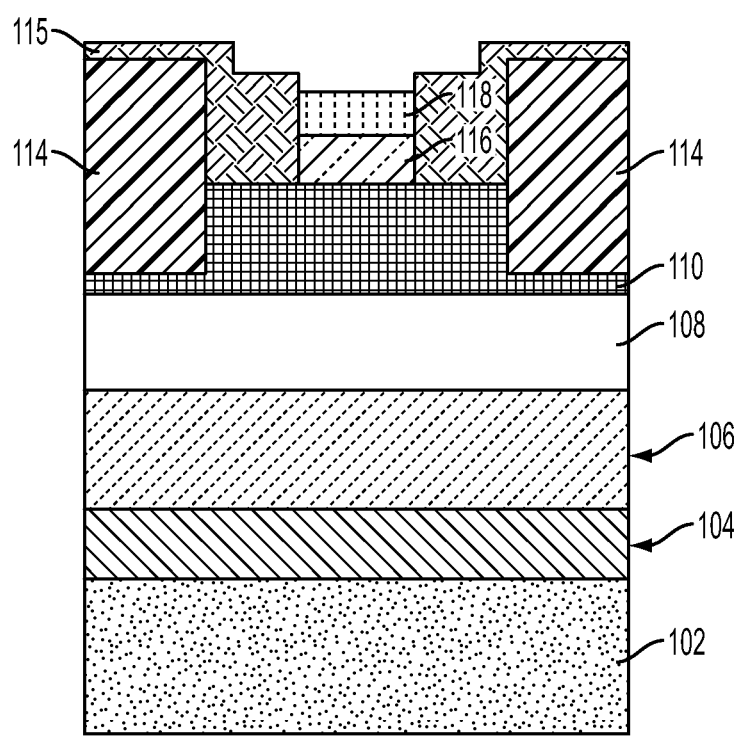

FIG. 5F is a cross-sectional view of the E-HEMT following operation 318 in accordance with one or more embodiments. The E-HEMT includes the p-GaN layer 116 over the active layer 110 in the gap 117 in the dielectric layer 115, and the n-GaN layer 118 over the p-GaN layer 116.

In operation 320 a barrier layer is formed over the n-GaN layer and dielectric layer. In some embodiments a patterned mask layer (i.e., a photoresistive layer) is formed on the barrier layer, and an etching process is performed to remove the barrier layer is removed except for a portion of the barrier layer over the n-GaN layer. The barrier layer 120 includes AlN. In some embodiments the barrier layer 120 includes one or more of AlN, SiO$_2$, Si$_3$N$_4$, Ga$_2$O$_3$, Sc$_2$O$_3$, HfO$_2$ and related compounds. In some embodiments, barrier layer 120 has a thickness ranging from about 5 angstroms (Å) to about 30 Å. In some embodiments, barrier layer 120 is formed by atomic layer deposition (ALD), chemical vapor deposition (CVD), wet oxidation, physical vapor deposition (PVD), remote plasma CVD (RPCVD), plasma enhanced CVD (PECVD), metal organic CVD (MOCVD), sputtering, plating, other suitable processes, and/or combinations thereof.

Figure 5G:
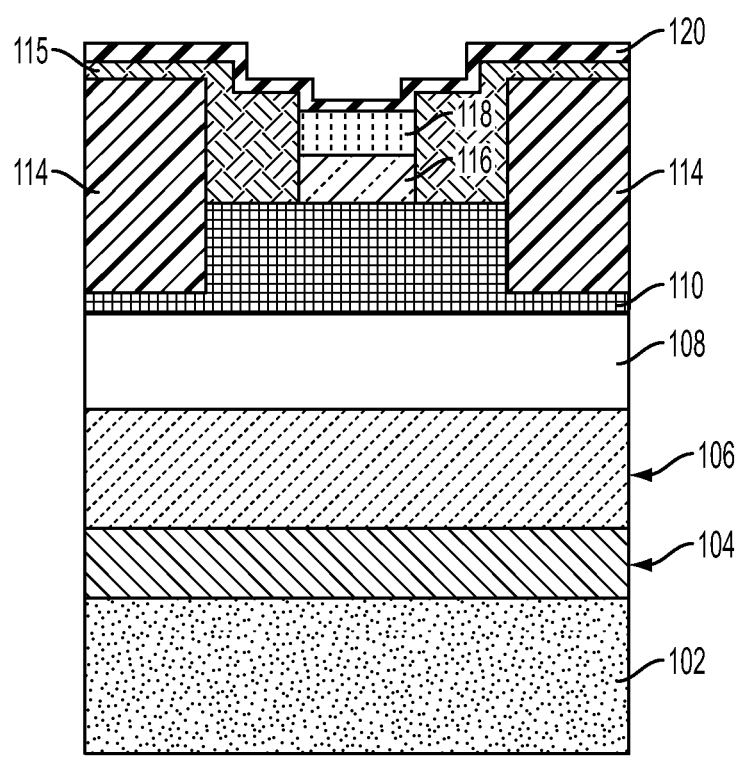

FIG. 5G is a cross-sectional view of the E-HEMT following operation 320 in accordance with one or more embodiments. The E-HEMT includes the barrier layer 120 over the n-GaN layer 118 and over the dielectric layer 115.

In operation 322 a gate is formed over the barrier layer, the n-GaN layer and the p-GaN layer. In some embodiments a metal layer is then deposited over the barrier layer. Another patterned photoresist layer is formed over the metal layer, and the metal layer is etched to form the gate of the E-HEMT. In some embodiments, the gate 122 includes titanium nitride (TiN), nickel gold alloy (NiAu), tungsten (W), tungsten nitride (WN), combinations thereof, or other suitable conductors. In some embodiments, the gate 122 has a thickness ranging from about 1000 Å to about 5000 Å.

Following operation 322 the E-HEMT has a similar structure to E-HEMT 100 in FIG. 1A. The E-HEMT includes the gate 122 over the barrier layer 120.

One aspect of this description relates to a transistor. The transistor includes a substrate, a channel layer over the substrate, and an active layer over the channel layer, wherein the active layer has a band gap discontinuity with the channel layer. The transistor further includes a metal diffusion barrier over the active layer and a gate over the metal diffusion barrier.

Another aspect of this description relates to a transistor. The transistor includes a substrate, a nucleation layer over the substrate, a graded layer over the nucleation layer, a channel layer over the graded layer, and an active layer over the channel layer, wherein the active layer has a band gap discontinuity with the channel layer that causes a 2-DEG to form. The transistor further includes source and drain electrodes over the active layer, a dielectric layer over the source and drain electrodes and over a portion of the active layer, the dielectric layer having a gap over the dielectric layer, a p-GaN layer over the active layer and in the gap, an n-GaN layer over the p-GaN layer, a barrier layer over the n-GaN layer, and a gate over the barrier layer.

Still another aspect of this description relates to a method of making a transistor. The method includes forming a channel layer over a substrate, forming an active layer over the channel layer, wherein the active layer has a band gap discontinuity with the channel layer, forming a metal diffusion barrier over the active layer, and forming a gate over the metal diffusion barrier.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device, comprising:
   a channel layer;
   an active layer over the channel layer, wherein the active layer has a band gap discontinuity with the channel layer that causes a 2-DEG to form;
   a dielectric layer over the active layer, the dielectric layer having a gap over the active layer;
   a p-GaN layer over the active layer and in the gap;
   an n-GaN layer over the p-GaN layer;
   a barrier layer over the dielectric layer and the n-GaN layer; and
   a gate over the barrier layer.

2. The semiconductor device of claim 1, further comprising:
   a source electrode over the channel layer, the source electrode at a first side of the gate; and
   a drain electrode over the channel layer, the drain electrode at a second side of the gate opposite the first side of the gate.

3. The semiconductor device of claim 1, wherein the n-GaN layer is entirely within the gap.

4. A transistor comprising:
   a substrate;
   a nucleation layer over the substrate;
   a graded layer over the nucleation layer;
   a channel layer over the graded layer;
   an active layer over the channel layer, wherein the active layer has a band gap discontinuity with the channel layer that causes a 2-DEG to form;
   source and drain electrodes over the active layer;
   a dielectric layer over the source and drain electrodes and over a portion of the active layer, the dielectric layer having a gap over the active layer;
   a p-GaN layer over the active layer and in the gap;
   an n-GaN layer over the p-GaN layer;
   a barrier layer over the dielectric layer and the n-GaN layer; and a gate over the barrier layer.

5. The transistor of claim 4, wherein at least some of the active layer is between the source electrode and the channel layer, and at least some of the active layer is between the drain electrode and the channel layer.

6. The transistor of claim 5, wherein the p-GaN layer has a thickness ranging from about 75 nanometers (nm) to about 100 nm.

7. A transistor comprising:
a substrate;
a channel layer over the substrate;
an active layer over the channel layer, wherein the active layer has a band gap discontinuity with the channel layer;
a dielectric layer over the active layer, wherein the dielectric layer exposes a portion of the active layer;
a metal diffusion barrier over the exposed portion of the active layer, wherein a portion of the metal diffusion barrier is over the dielectric layer; and
a gate over the metal diffusion barrier.

8. The transistor of claim 7, wherein the metal diffusion barrier further comprises:
a p-GaN layer over the portion of the active layer;
an n-GaN layer over the p-GaN layer; and
a barrier layer over the dielectric layer and the n-GaN layer, the barrier layer including aluminum nitride (AlN).

9. The transistor of claim 7, wherein a top portion of the substrate is doped with p-type dopants to a dopant concentration ranging from about $1\times10^{18}$ ions/cm$^3$ to about $1\times10^{23}$ ions/cm$^3$.

10. The transistor of claim 7, wherein the dielectric layer defines a gap, at least a portion of the metal diffusion barrier being in the gap.

11. The transistor of claim 7, further comprising:
a source electrode over the channel layer, the source electrode at a first side of the gate;
a drain electrode over the channel layer, the drain electrode at a second side of the gate, wherein the band gap discontinuity causes a two dimensional electron gas (2-DEG) to form and wherein the gate is configured to control a conductivity of the 2-DEG between the source electrode and the drain electrode.

12. The transistor of claim 7, wherein the metal diffusion barrier further comprises:
a p-type gallium nitride (p-GaN) layer over the exposed portion of the active layer.

13. The transistor of claim 12, wherein the p-GaN layer has a thickness ranging from about 75 nanometers (nm) to about 100 nm.

14. The transistor of claim 7, wherein the metal diffusion barrier further comprises:
an n-type gallium nitride (n-GaN) layer over the exposed portion of the active layer.

15. The transistor of claim 14, wherein the n-GaN layer has a thickness ranging from about 10 nm to about 30 nm.

16. The transistor of claim 7, wherein the metal diffusion barrier further comprises:
a barrier layer over the dielectric layer and the exposed portion of the active layer.

17. The transistor of claim 16, wherein the barrier layer has a thickness ranging from about 5 angstroms (Å) to about 30 Å.

18. The transistor of claim 7, further comprising:
a nucleation layer between the substrate and the channel layer.

19. The transistor of claim 18, further comprising:
a graded layer between the nucleation layer and the channel layer.

20. The transistor of claim 19, wherein the graded layer comprises:
a first graded layer including $Al_xGa_{1-x}N$, where x ranges from 0.7 to 0.9;
a second graded layer on the first graded layer, the second graded layer including $Al_yGa_{1-y}N$, where y ranges from 0.4 to 0.6; and
a third graded layer on the second graded layer, the third graded layer including $Al_zGa_{1-z}N$, where z ranges from 0.15 to 0.3.

* * * * *